United States Patent
Tsuchiya (10) Patent No.: US 8,120,117 B2
(45) Date of Patent: Feb. 21, 2012

(54) SEMICONDUCTOR DEVICE WITH METAL GATE

(75) Inventor: Yoshinori Tsuchiya, Clifton Park, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 12/434,070

(22) Filed: May 1, 2009

(65) Prior Publication Data

US 2010/0276760 A1   Nov. 4, 2010

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/369; 257/413; 438/664

(58) Field of Classification Search .......... 257/369, 257/413, E27.062, E21.476; 438/664
See application file for complete search history.

(56) References Cited

U.S. PATENT DOCUMENTS

| | | | | |
|---|---|---|---|---|
| 5,510,651 A | * | 4/1996 | Maniar et al. | 257/751 |
| 7,189,431 B2 | * | 3/2007 | Yamasaki et al. | 427/250 |
| 7,863,126 B2 | * | 1/2011 | Park et al. | 438/216 |
| 2008/0146042 A1 | * | 6/2008 | Kostamo et al. | 438/778 |
| 2010/0013021 A1 | * | 1/2010 | Chen et al. | 257/369 |

FOREIGN PATENT DOCUMENTS

JP   2008-084970   4/2008

OTHER PUBLICATIONS

E. Cartier, et al, "Role of Oxygen Vacancies in VFB/Vt stability of pFET metals on HfO2," Symposium on VLSI Technology Digest of Technical Papers, 2005.
Z. Li, et al, "Flatband voltage shift of ruthenium gated stacks and its link with the formation of a thin ruthenium oxide layer at the ruthenium/dielectric interface," Journal of Applied Physics, 2007.

* cited by examiner

*Primary Examiner* — Phuc Dang
(74) *Attorney, Agent, or Firm* — Turocy & Watson, LLP (57) ABSTRACT

Gate electrode structures having a thin layer of $ReO_3$ formed with high effective work function and high heat resistance are disclosed. The thin layer of $ReO_3$ is formed by providing a semiconductor structure having an oxygen-containing metal alloy layer and a rhenium layer. A heat annealing step diffuses Re from the rhenium layer through the high-oxygen containing metal alloy layer to form a thin layer of $ReO_3$.

8 Claims, 7 Drawing Sheets

SEMICONDUCTOR DEVICE WITH METAL GATE

TECHNICAL FIELD

Described are semiconductor devices having a metal gate with high work function and high temperature stability.

BACKGROUND

Metal-oxide semiconductor field-effect transistors (FET) are a common component of integrated circuits and are typically formed by doping a Si- or Ge-based semiconductor substrate followed by deposition of several layers of semiconductor material to form a gate electrode used to control conductance through the FET. A FET can be formed as a p-type FET (pFET), having a source and a drain formed from regions doped with p-type atoms, or as a n-type FET (nFET), having a source and a drain formed from regions doped with n-type atoms. Often, pFET structures are co-fabricated with analogous nFET structures to form logic gates and other semiconductor devices. In addition to source and drain regions, FET structures are formed by depositing a layer of gate high dielectric (high k) material and a layer of conducting material (often having metal and/or highly doped poly-crystalline silicon) over a semiconductor substrate with the appropriate source having drain and channel regions doped therein. In pFET structures, an electric field created by applying a negative gate-source voltage to the gate electrode causes a build up of holes to form at the boundary of high dielectric material and the transistor channel. When a sufficient voltage is applied (threshold voltage), a conductance channel is established allowing current to flow from the source to the drain. The nature of the gate material has a large effect on the threshold voltage of the transistor. A change in effective work function between the gate electrode material and the channel material as well as electrical charges in/at gate dielectric layers/interfaces can modulate the threshold voltage of a transistor.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

High dielectric materials and metal gate for pFET structures having an effective work function higher than about 4.6 eV and stability during the high temperatures required in semiconductor fabrication are disclosed herein. The high work function property is obtained by forming a thin layer of $ReO_3$ at the boundary between a high dielectric (high k) gate material and a gate electrode structure. The gate electrode has a laminated structure with the thin layer of $ReO_3$ close to the semiconductor substrate and the high k gate material and a high oxygen-containing metal-alloy layer, Re (rhenium) layer, and Si-containing metallic layer formed over the thin layer of $ReO_3$, in the order recited, that form the balance of the laminated structure of the gate electrode.

One aspect of the invention is directed toward semiconductor devices having a pFET structure incorporating a thin layer of $ReO_3$. The pFET structure has a high dielectric material layer formed over a semiconductor substrate; an oxygen-contained metal alloy layer formed over the high dielectric material; and a Re layer formed over the oxygen-contained metal alloy layer, wherein a layer of $ReO_3$ is located between the high dielectric material layer and the oxygen-contained metal alloy layer.

An additional aspect of the invention is directed toward a method for fabricating a pFET structures. Acts for forming the pFET structure include depositing a layer of high dielectric material over a semiconductor substrate; depositing a metal alloy layer in the presence of oxygen to form an oxygen-contained medal alloy layer; depositing a layer comprising one or more of Re and $ReO_3$; depositing a layer of poly-Si, poly-SiGe or the like; and heating the semiconductor device such that a thin layer of $ReO_3$ forms between the deposited layer of high dielectric material and the deposited layer of oxygen-contained metal alloy.

A further aspect of the invention is directed toward a method of diffusing Re to form a thin layer of $ReO_3$. A semiconductor electrode structure having a laminated structure of a layer of oxygen-containing metal alloy formed below a layer of Re is heated to form a layer of $ReO_3$ located between the layer of oxygen-containing metal alloy and a dielectric layer formed on a semiconductor substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detained description of the invention when considered in conjunction with the drawings.

DETAILED DESCRIPTION

The innovations disclosed herein are applicable to any semiconductor device employing pFET structures. In particular, the innovations disclosed herein are applicable to pFET structures having a low threshold voltage of about −500 mV to 0 mV and/or pFET structures having a gate electrode with an effective work function of about 4.6 eV or more. The innovations are achieved by formation of a thin $ReO_3$ layer between the gate dielectric (high k material) and the remaining structures of the gate electrode.

Low threshold voltages are obtainable by formation of a gate electrode having a high work function. The effective work function is the difference of Fermi-energy between gate electrode and channel region. The effective work function can be evaluated by measuring C-V characteristics of MOS capacitor, and measured flat-band voltage and dopant concentration in channel region. In the inventive semiconductor devices disclosed herein, a high work function is created by forming a layer of $ReO_3$ of about atomic depth on the surface of the gate dielectric with the remaining structure of the gate electrode placed over the thin layer of $ReO_3$. The thin layer of $ReO_3$ is formed via a heat-facilitated diffusion process. Initially, a layer of oxygen-containing metal alloy and a layer of Re are formed, successively, over the gate dielectric material. Then, a rapid thermal anneal is performed that causes Re to diffuse from the Re layer through the oxygen-containing metal-alloy layer. The rapid thermal anneal results in an about atomic depth layer of $ReO_3$ formed between the high k gate dielectric material and the layer of oxygen-containing metal alloy, and Re atoms located in the grain boundaries of the metal-alloy layer.

The innovations disclosed herein are now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the invention.

Those skilled in the art will recognize that well-known semiconductor fabrication techniques including depositing semiconductor materials, masking, photolithography, etching, and implanting are useful in forming the described devices. Deposition of semiconductor materials can be by low pressure chemical vapor deposition, chemical vapor deposition, atomic layer deposition, and the like. Conserved reference numbers match like elements.

Terms, such as "on," "above," "below," and "over," used herein, are defined with respect to the plane defined by the surface of a semiconductor substrate. The terms "on," "above," "over," etc. indicate that the subject element is farther away from the plane of the semiconductor substrate than another element referred to as a spatial reference. The term "below" and similar terms indicate that the subject element is closer to the plane of the semiconductor substrate than another element referred to as a spatial reference. The terms "on," "above," "below," and "over," etc. only indicate a relative spatial relationship and do not necessarily indicate that any particular elements are in physical contact. The "surface of the semiconductor substrate" is defined as the surface of the semiconductor substrate upon which device elements are built. The preceding definitions apply throughout this document.

Those skilled in the art will recognize that well-known semiconductor fabrication techniques including depositing semiconductor materials, masking, photolithography, etching, and implanting are useful in forming the described devices. Deposition of semiconductor materials can be by low pressure chemical vapor deposition, chemical vapor deposition, atomic layer deposition, and the like. Conserved reference numbers match like elements.

N-type atoms and dopants include any atom, ion or composition that introduces additional equivalents of negative change that can be used to support a current of negative charge in a semiconductor material. N-type atoms and dopants include elements located in group 15 of the periodic table and include phosphorous and arsenic. P-type atoms and dopants include any atom, ion or composition that introduces additional equivalents of positive charge (or electron holes) that can be used to support a current of positive charge in a semiconductor material. P-type atoms and dopants include elements located in group 13 of the periodic table and include boron, aluminum, gallium and indium.

FIGS. 1 through 7 depict an exemplary process for forming pFET structures in accordance with the innovations disclosed herein. The described process shows the concurrent formation of pFET and nFET devices as is common for the fabrication of logic gates, CMOS (complementary metal-oxide-semiconductor) devices and other semiconductor devices employing pFET and nFET structures. Those skilled in the art will readily recognize that semiconductor devices containing only pFET structures and/or pFET structures in combination with other types of semiconductor structures can be formed in accordance with the processes disclosed herein. Structures having an atomic depth $ReO_3$ layer can be formed through other processes and are included within the scope of the invention.

Figure 1:
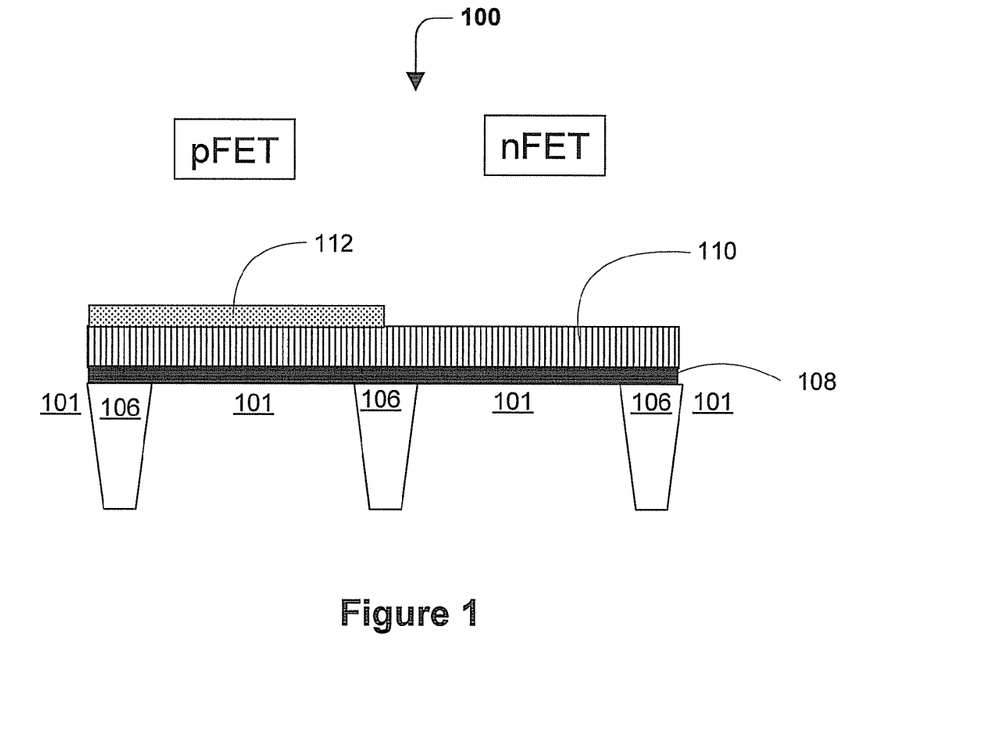
FIG. 1 is an illustration of a semiconductor structure useful in manufacturing semiconductor devices in accordance with an aspect of the invention.

FIG. 1 depicts a first structure for forming a semiconductor device in accordance with the innovations disclosed herein. Isolation regions 106 are formed on a semiconductor substrate 101 with each transistor region separated by an isolation region 106. Each transistor region has a source, drain and channel region that are formed by well-known ion implantation techniques at down-stream stages of processing.

A gate dielectric layer 108 is formed over the semiconductor substrate 101. The gate dielectric can be any material with a high dielectric constant. The gate dielectric can be hafnium dioxide or a metal-silicon material. Metal-silicon-oxide materials included compositions having the following chemical formulae: MSiO, MSiON, $M_1M_2SiO$, $M_xSi_1-xO_2$, $M_xSi_{1-x}O_2$, and $M_xSi_{1-x}ON$, wherein M and $M_1$ are independently an element of Group IVA or an element from the Lanthanide Series; $M_2$ is nitrogen, an element of Group IVA, or an element from the Lanthanide Series; and x is less than 1 and greater than 0. Specific examples include $Hf_xSi_{1-x}O_2$, $Hf_xSi_{1-x}ON$, $Zr_xSi_{1-x}O_2$, $Zr_xSi_{1-x}ON$, $La_xSi_{1-x}O_2$, $La_xSi_{1-x}ON$, $Gd_xSi_{1-x}O_2$, $Gd_xSi_{1-x}ON$, HfZrSiO, HfZrSiON, HfLaSiO, and HfGdSiO, where x is between 0 and 1. In one embodiment, the thickness of the gate dielectric layer 108 is from about 0.1 nm to about 25 nm. In another embodiment, the thickness of the gate dielectric layer 108 is from about 0.2 nm to about 20 nm. In yet another embodiment, the thickness of the gate dielectric layer 108 is from about 0.3 nm to about 10 nm.

A metal-alloy layer 110 is formed over the gate dielectric layer 108. The metal-alloy layer 110 can be one or more of TiN, TiAlN, TiC, TaC, TaN, TaAlC, and TaAlN. The metal-alloy layer is enriched with oxygen, where the oxygen content is controllable by adjusting $O_2$ pressure during deposition of the metal-alloy layer 110. In one embodiment, the partial pressure of $O_2$ during deposition of the metal-alloy layer is from about 1 kPa to about 50 kPa. In another embodiment, the partial pressure of $O_2$ during deposition of the metal-alloy layer is from about 5 kPa to about 30 kPa. In yet another embodiment, the partial pressure of $O_2$ during deposition of the metal-alloy layer is from about 5 kPa to about 15 kPa. In one embodiment, the concentration of oxygen in the metal-alloy layer is from about 0.5 to about 30 percent by weight. In another embodiment, the concentration of oxygen in the metal-alloy layer is from about 1 to about 20 percent by weight. In yet another embodiment, the concentration of oxygen in the metal-alloy layer is from about 1 to about 10 percent by weight. In one embodiment, the depth of the deposited metal-alloy layer 110 is greater than about 1 nm. In another embodiment, the depth of the deposited metal-alloy layer 110 is from about 2 nm to about 50 nm. In yet another embodiment, the depth of the deposited metal-alloy layer 110 is from about 2 nm to about 30 nm.

A Re layer 112 is formed over the metal-alloy 110. The Re layer 112 can contain Re metal atoms and/or $ReO_3$. The Re layer 112 is only deposited over the regions of the semiconductor device 100 where pFET structures are to be built. Well-known masking techniques can be used to selectively target the regions where the Re layer 112 will be deposited. In one embodiment, the thickness of the Re layer 112 is from about 1 nm to about 25 nm. In another embodiment, the thickness of the Re layer 112 is from about 1 nm to about 20 nm. In yet another embodiment, the thickness of the Re layer 112 is from about 2 nm to about 10 nm.

Figure 2:
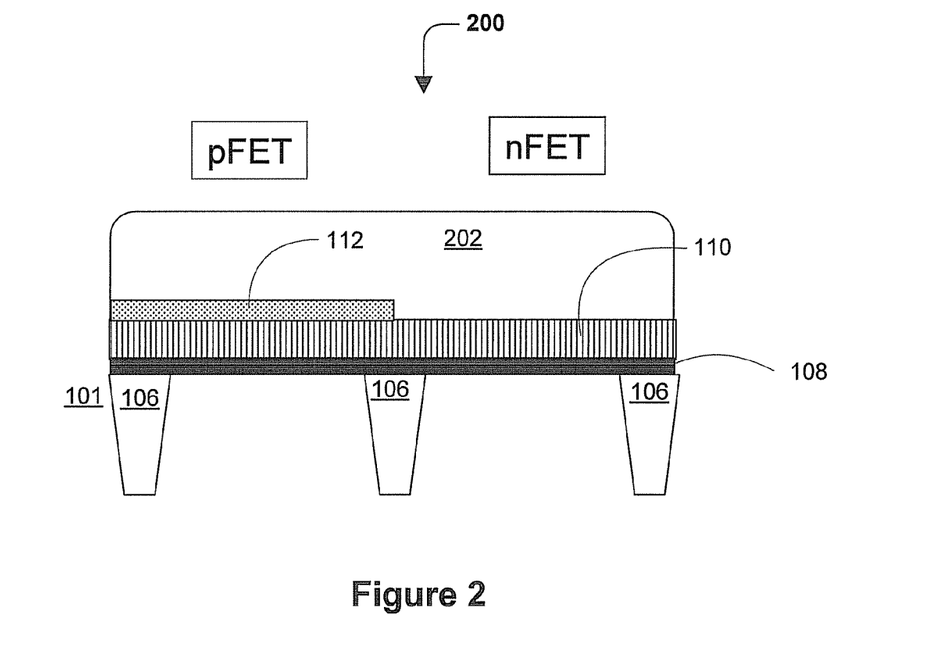
FIG. 2 is an illustration of a semiconductor structure useful in manufacturing semiconductor devices in accordance with an aspect of the invention.

Referring to FIG. 2, a layer of doped polysilicon (poly-Si) or polysilicon-germanium (poly-SiGe) 202 is deposited over semiconductor device 100 shown in FIG. 1 to form semiconductor device 100. Layer 202 can comprise other substances other than poly-Si and poly-SiGe that are suitable for forming a silicide. In one embodiment, the thickness of the poly-Si or poly-SiGe layer 202 is from about 5 nm to about 100 nm. In another embodiment, the thickness of the poly-Si or poly-SiGe layer 202 is from about 10 nm to about 75 nm. In yet another embodiment, the thickness of the poly-Si or poly-SiGe layer 202 is from about 15 nm to about 60 nm.

Figure 3:
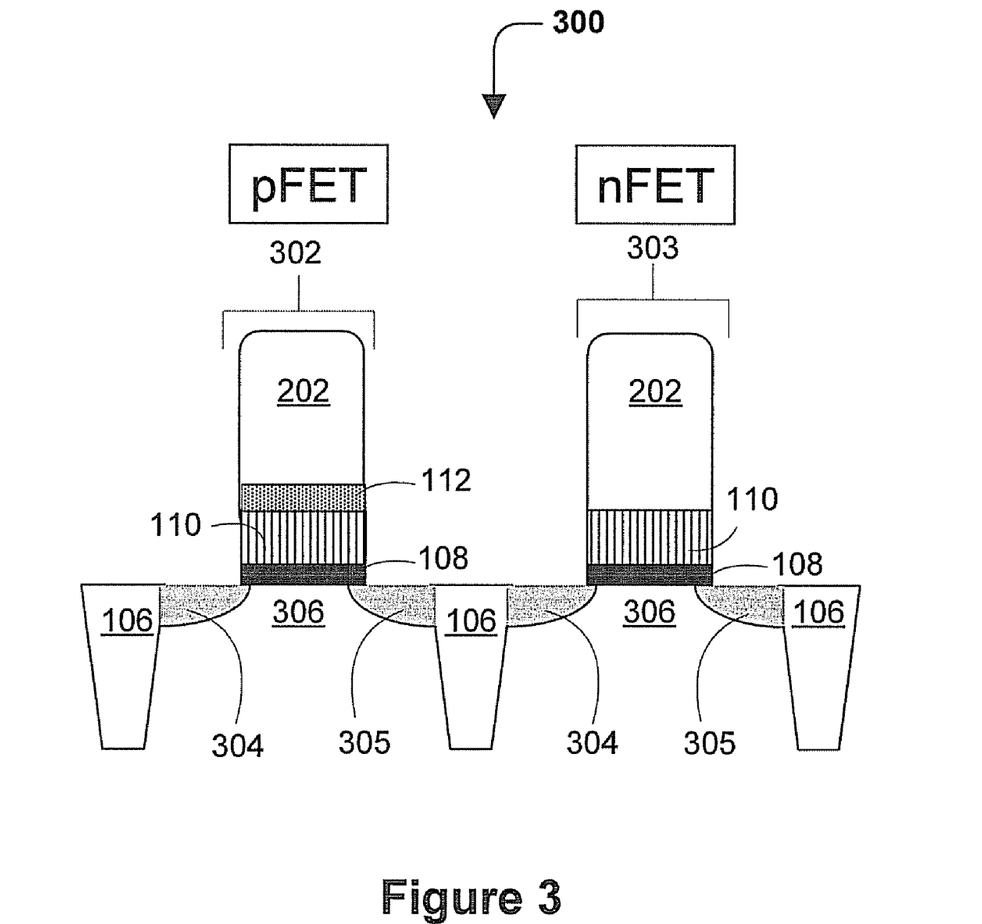
FIG. 3 is an illustration of a semiconductor structure useful in manufacturing semiconductor devices having gate electrodes formed for p-type and n-type transistors in accordance with an aspect of the invention.

Referring to FIG. 3, well-known etching techniques are used to form vertical separations in layers 108, 110, 112 and 202 to form physically separated gate electrodes 302 (pFET structures) and 303 (nFET structures) in semiconductor device 300. Dry etching and/or wet etching techniques can be used.

For pFET structures, the source 304 and drain 305 are created by implantation with p-type ions using well-know techniques. For pFET structures, the source 304 and drain 305 are formed in a region of the semiconductor having n-type atoms such that a channel 306 is formed between the source 304 and the drain 305 has n-type properties. For nFET structures, the source 304 and drain 305 are created by implantation with n-type ions using well-know techniques. For pFET structures, the source 304 and drain 305 are formed in a region of the semiconductor having p-type atoms such that the channel 306 formed between the source and the drain has p-type properties.

Figure 4:
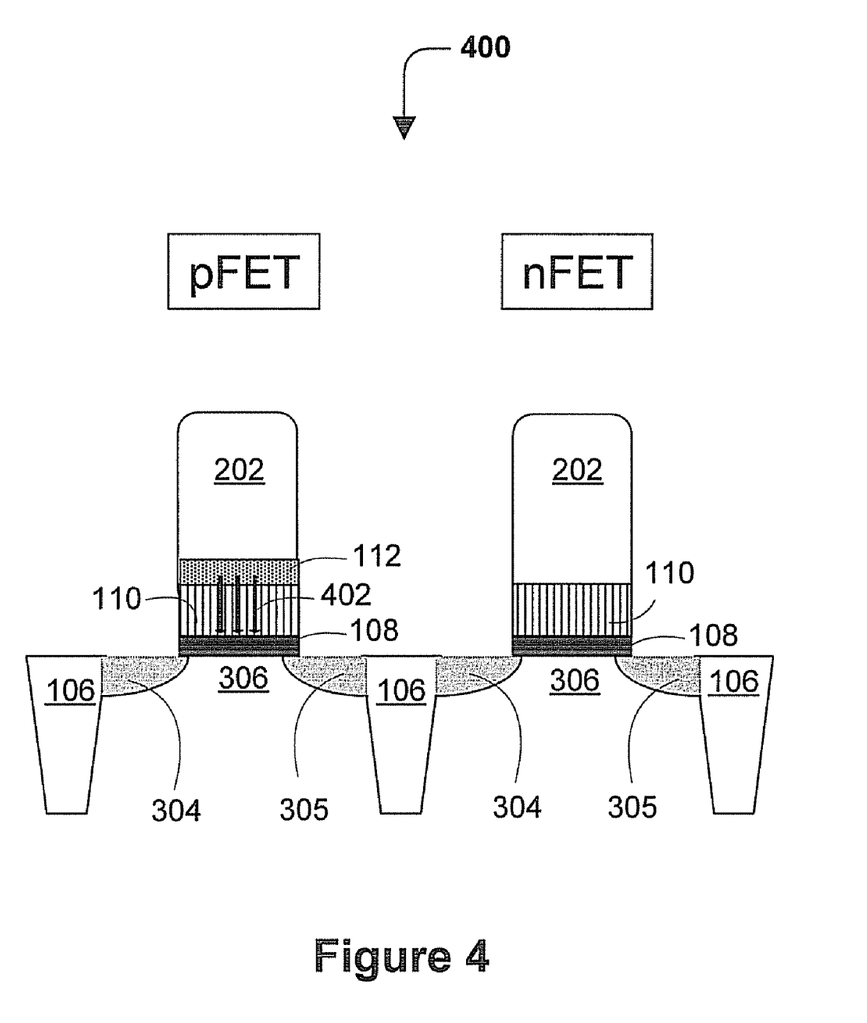
FIG. 4 is an illustration of a semiconductor structure useful in manufacturing semiconductor devices where the semiconductor structure can form a thin $ReO_3$ layer through a heating step in accordance with an aspect of the invention.
Figure 5:
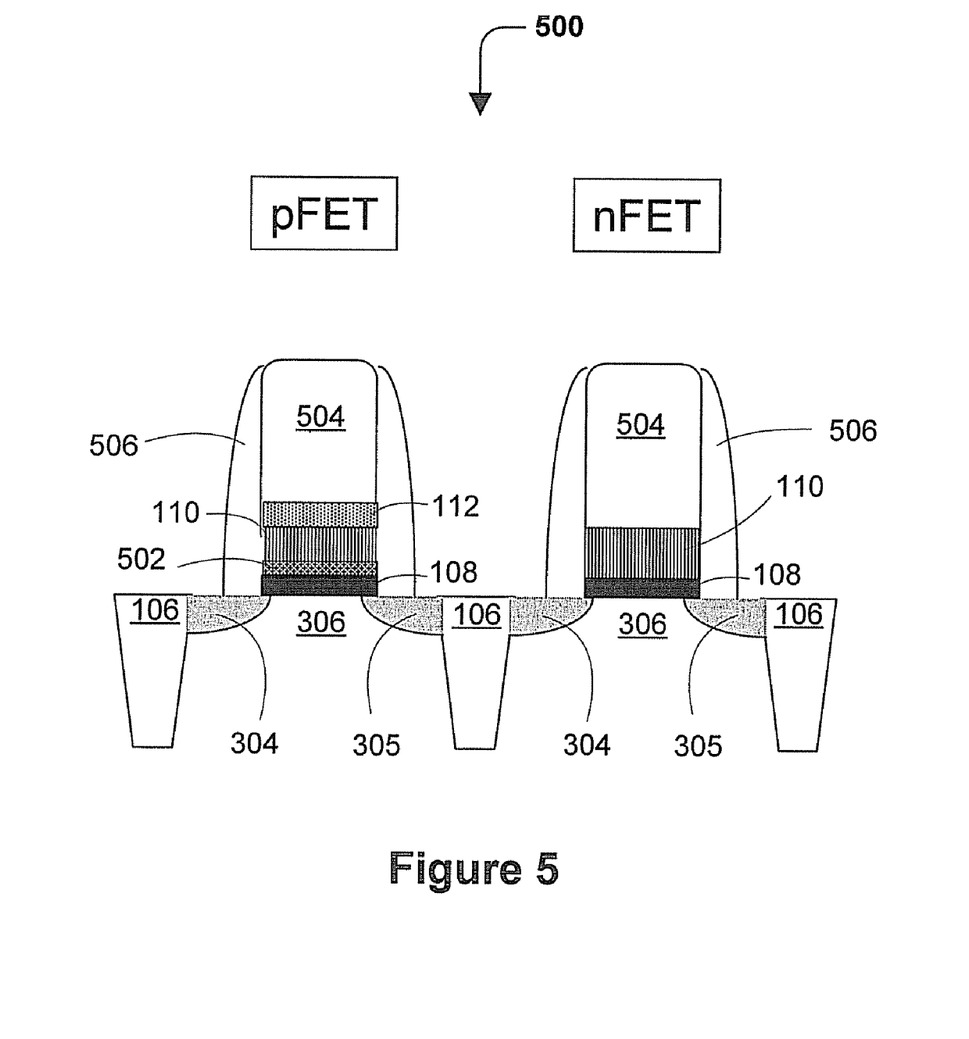
FIG. 5 is an illustration of a semiconductor device having a thin $ReO_3$ layer in accordance with an aspect of the invention.

Referring to FIG. 4, the semiconductor device 400 undergoes a heat activation process to form a thin $ReO_3$ layer (reference number 502 in FIG. 5) on the surface of the gate dielectric layer 108. The semiconductor device 400 is heated at a temperature of about 1000° C. or higher for a time period less than about 60 seconds. Alternatively, semiconductor device 400 can be subjected to laser annealing for a period from about 10 to about 500 msec. The heat activation process induces a diffusion of Re atoms from layer 112 to the boundary between layers 110 and 108. As Re atoms diffuse through the oxygen-containing metal-alloy layer 110, the Re oxidizes to form $ReO_3$. The direction of diffusion of Re atoms is shown in FIG. 4 by arrows 402. The thin $ReO_3$ layer formed after the heat activation step is shown in FIG. 5 as layer 502. In one embodiment, the thin $ReO_3$ layer 502 is of approximately atomic width. In another embodiment, the thin $ReO_3$ layer 502 is from about 0.2 to about 2 nm in width. In yet another embodiment, the thin $ReO_3$ layer 502 is from about 0.1 to about 1 nm in width.

FIG. 5 depicts semiconductor device 500 following heat activation to form a thin $ReO_3$ layer 502 and conversion of the poly-Si or poly-SiGe layer 202 to a Si-containing metallic layer 504. The Si-containing metallic layer 504 can be formed by any known technique to form a silicide including rapid thermal annealing (RTA) techniques. A metal film, which can be but is not limited to one or more of Ni, Pt, Co, Pd and Ti, is deposited on the poly-Si or poly-SiGe layer 202 and heated to form the Si-contained metallic layer 504. Annealing is performed at about 300 to about 800° C. to form the Si-containing metallic layer 504. The Si-containing layer 504 can contain one or more selected from poly-Si, poly-SiGe, Ni-silicide, NiPt-silicide, NiPd-silicide, Ti-silicide and Co-silicide. At this point, sidewall spacers 506 can be formed out of a dielectric material on either side of the laminated electrode structures.

Figure 6:
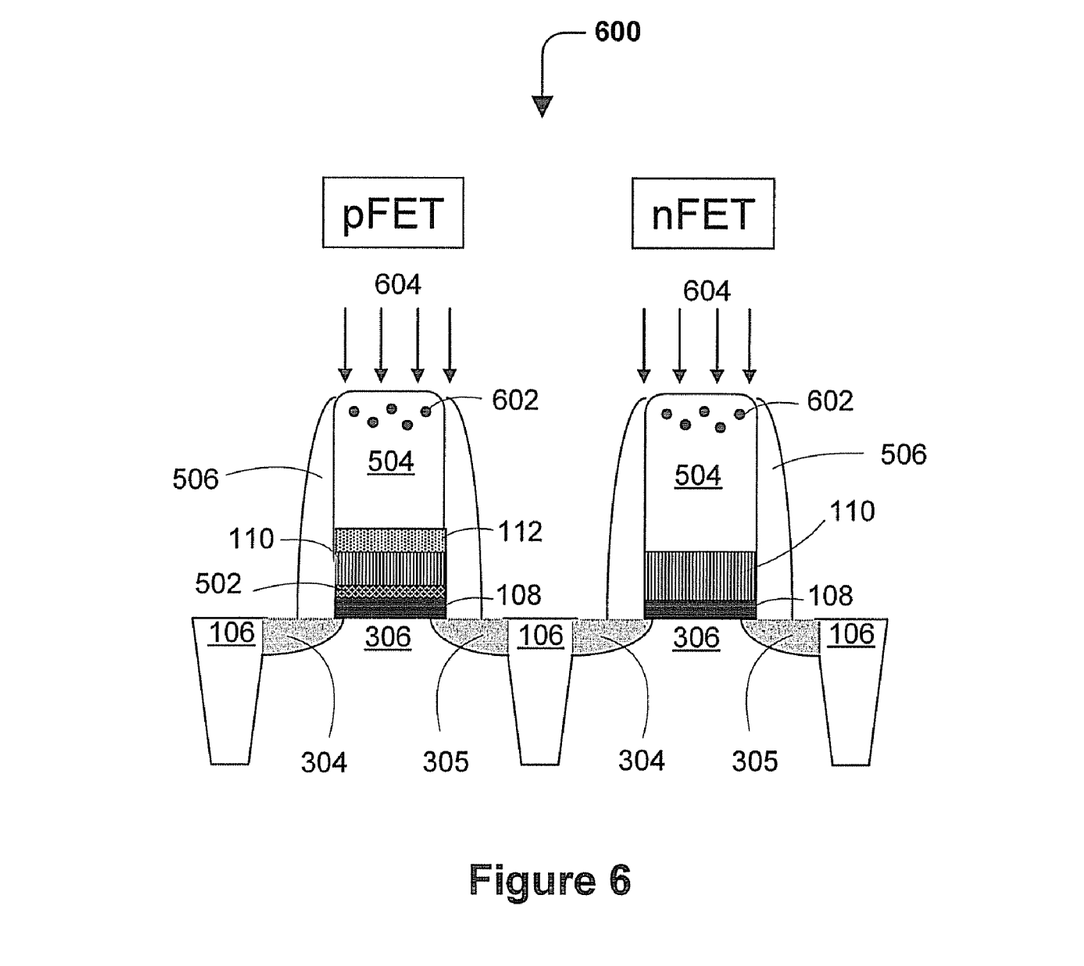
FIG. 6 is an illustration of a semiconductor device having a thin $ReO_3$ layer and implanted Al in accordance with an aspect of the invention.

In FIG. 6, Al atoms 604 are implanted into the Si-containing layer 504 through use of an Al ion implantation beam 604. Standard ion implantation techniques can be used. In one embodiment, the implantation energy is less than about 20 keV. In another embodiment, the implantation energy is less than about 10 keV. Implantation is performed until the concentration of Al atoms on the surface of the Si-containing metallic layer 504 is equal to or larger than about $5 \times 10^{15}$ atoms/cm2.

Figure 7:
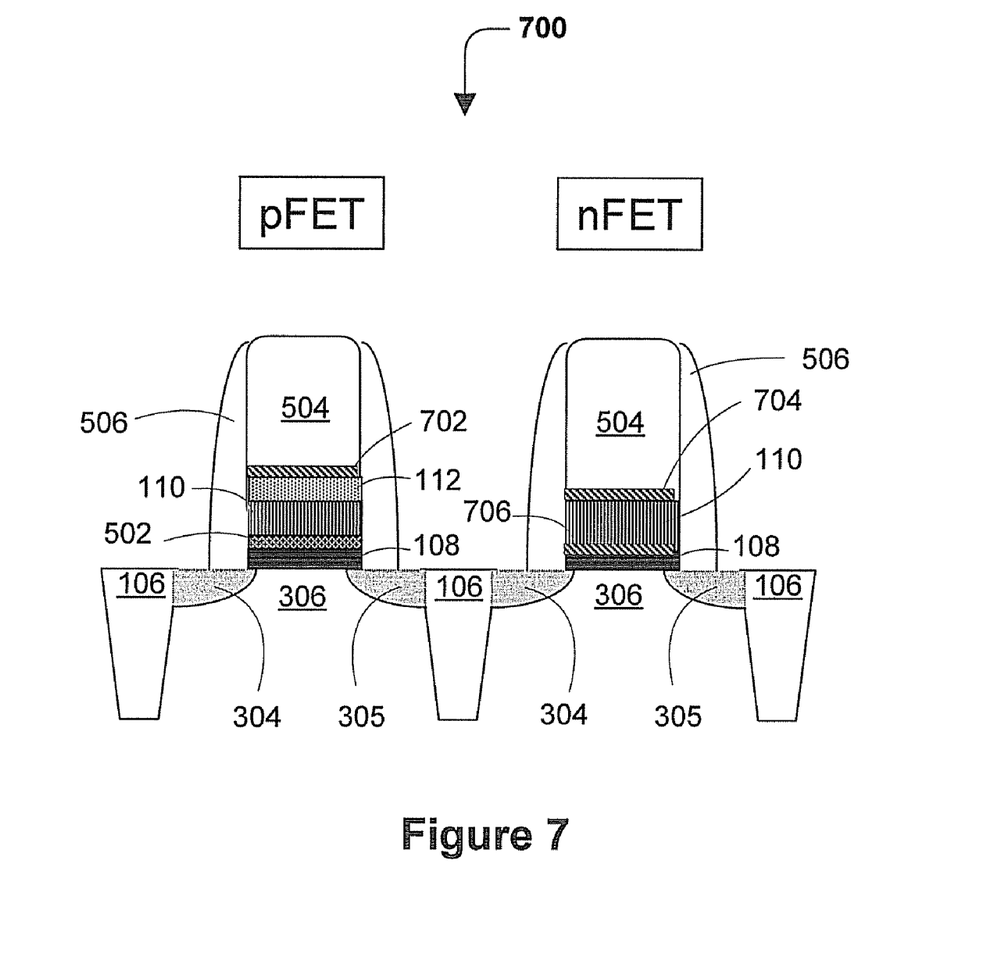
FIG. 7 is an illustration of a semiconductor device having a thin $ReO_3$ layer and an Al—Re alloy layer in accordance with an aspect of the invention.

In FIG. 7, the implanted Al atoms are diffused by a heating step. Heating is performed for a time period of at least about 1 minute. In one embodiment, heating is performed from about 300° C. to about 700° C. In another embodiment, heating is performed from about 350° C. to about 600° C. In yet another embodiment, heating is performed from about 400° C. to about 550° C. There is a difference between the pattern of diffusion of Al atoms between areas formed to be a pFET structures and areas formed to be nFET structures. For pFET structures, Al diffusion stops at the Re layer 112 to form an Al—Re alloy 702 between the Si-containing metallic layer 504 and the metal-alloy layer 110. In nFET structures, a first Al layer 704 forms between the Si-containing metallic layer 504 and the metal-alloy layer 110 and a second Al layer 706 forms between the metal-alloy layer 110 and the gate dielectric layer 108. After the diffusion of Al is completed, pFET structures have an effective work function greater than about 4.6 eV and any optionally formed nFET structures have an effective work function less than about 4.4 eV.

In one embodiment, the effective work function of a gate electrode for a pFET structure is from about 4.6 to about 5.6 eV. In another embodiment, the effective work function of a gate electrode for a pFET structure is from about 4.6 to about 5 eV. In yet another embodiment, the effective work function of a gate electrode for a pFET structure is from about 4.6 to about 4.9 eV.

In one embodiment, the semiconductor devices disclosed herein can withstand a temperature of at least 600° C. during or after fabrication and maintain the function of a FET device. In another embodiment, the semiconductor devices disclosed herein can withstand a temperature of about 200° C. to about 600° C. during or after fabrication and maintain the function of a FET device. In yet another embodiment, the semiconductor devices disclosed herein can withstand a temperature of about 300° C. to about 500° C. during or after fabrication and maintain the function of a FET device.

The discussion above in relation to FIGS. 1 through 7 is illustrative only of certain embodiments of the innovations disclosed herein. The embodiments shown in FIGS. 1 through 7 are particularly useful to demonstrate the formation of pFET structures concurrently with nFET structures as frequently employed in logic gate semiconductor devices. Those skilled in the art will understand that the subject innovation is directed toward a novel method of diffusing Re atoms to form a thin layer of $ReO_3$ within a semiconductor device. The diffusion of Re can be performed in any semiconductor device having a layer comprising Re and a layer comprising an oxygen-containing metal alloy layer without the need for any other specific semiconductor device components. Those having skill in the art will ready recognizes numerous arrangements wherein heating of a semiconductor device having a layer comprising Re and a layer comprising an oxygen-containing metal alloy will result in the diffusion of Re atoms through the layer comprising an oxygen-containing metal alloy to form a thin layer of $ReO_3$ atoms, as described above.

With respect to any figure or numerical range for a given characteristic, a figure or a parameter from one range may be combined with another figure or a parameter from a different range for the same characteristic to generate a numerical range.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A semiconductor device having a p-type field effect transistor,
    comprising:
        a high dielectric material layer formed over a semiconductor substrate;
        an oxygen-containing metal alloy layer formed over the high dielectric material;
        a Re layer formed over the oxygen-containing metal alloy layer,
        wherein a layer of $ReO_3$ is located between the high dielectric material layer and the oxygen-containing metal alloy layer, and
    an n-type field effect transistor comprising:
        a high dielectric material layer formed over the semiconductor substrate;
        an oxygen-containing metal alloy layer formed over the high dielectric material;
        a Si-containing metallic layer formed over the oxygen-contained metal alloy layer;
        an Al layer located between the high dielectric material layer and the oxygen-contained metal alloy layer; and
        an Al layer located between the Si-containing metal alloy layer and the oxygen-containing metal alloy layer.

2. The semiconductor device of claim 1, wherein a gate electrode of the p-type field effect transistor has an effective work function greater than about 4.6 eV.

3. The semiconductor device of claim 1, wherein the $ReO_3$ layer has a width from about 0.2 to about 2 nm.

4. The semiconductor device of claim 1, wherein the oxygen-contained metal alloy layer comprises one or more selected from TiN, TiAlN, TiC, TaC, TaN, TaAlC, and TaAlN.

5. The semiconductor device of claim 1, further comprising a Si containing metallic layer formed over the Re layer, wherein the Si containing metallic layer comprises one or more selected from poly-Si, polySiGe, Ni-silicide, NiPt-silicide, NiPd-silicide, Ti-silicide and Co-silicide.

6. The semiconductor device of claim 1, wherein the oxygen-containing metal alloy layer comprises from about 0.5 to about 30 percent by weight of oxygen.

7. The semiconductor device of claim 1, wherein the oxygen-containing metal alloy layer comprises Re atoms in at least a portion of the grain boundaries of the oxygen-contained metal alloy layer.

8. The semiconductor device of claim 1, further comprising a Si-containing metallic layer formed over the Re layer.

* * * * *